US012648119B2

(12) United States Patent
Fedorikhin et al.

(10) Patent No.: US 12,648,119 B2
(45) Date of Patent: Jun. 2, 2026

(54) INTEGRATED E-MACHINE CONTROLLER FOR TURBOMACHINE HAVING THERMAL PATH FOR COMPACTLY PACKAGED ELECTRONICS

(71) Applicant: Garrett Transportation I Inc, Torrance, CA (US)

(72) Inventors: Valeriy Fedorikhin, Redondo Beach, CA (US); Ali Mohammadpour, Redondo Beach, CA (US); Andrew Love, Marina Del Rey, CA (US)

(73) Assignee: GARRETT TRANSPORTATION I INC, Torrance, CA (US)

( * ) Notice: Subject to any disclaimer, the term of this patent is extended or adjusted under 35 U.S.C. 154(b) by 831 days.

(21) Appl. No.: 17/447,300

(22) Filed: Sep. 10, 2021

(65) Prior Publication Data

US 2023/0082371 A1 Mar. 16, 2023

(51) Int. Cl.
| | |
|---|---|
| *H05K 7/20* | (2006.01) |
| *H02G 5/10* | (2006.01) |
| *H02K 7/14* | (2006.01) |

(52) U.S. Cl.
CPC ........... *H05K 7/20927* (2013.01); *H02G 5/10* (2013.01); *H02K 7/14* (2013.01)

(58) Field of Classification Search
CPC ........ H05K 7/20927; H02G 5/10; H02K 7/14; H02K 5/20; H02K 2203/03; H02K 2203/09; H02K 2211/03; H02K 11/33; F04D 17/10; F04D 25/06; F04D 29/5813; F05D 2220/40
See application file for complete search history.

(56) References Cited

U.S. PATENT DOCUMENTS

| | | | |
|---|---|---|---|
| 7,352,077 | B2 | 4/2008 | Shibui et al. |
| 10,462,937 | B1 | 10/2019 | Louco et al. |
| 2005/0223727 | A1 | 10/2005 | Funahashi et al. |
| 2012/0299432 | A1* | 11/2012 | Ishino .................... H02K 3/522 310/215 |
| 2019/0368413 | A1* | 12/2019 | Carter ................ H05K 7/20927 |
| 2020/0080470 | A1 | 3/2020 | Hehn et al. |
| 2020/0191014 | A1* | 6/2020 | Garrard ................... F01D 25/12 |
| 2023/0118102 | A1* | 4/2023 | Wallington ............. F02B 33/40 290/52 |

FOREIGN PATENT DOCUMENTS

| | | |
|---|---|---|
| EP | 2305981 B1 | 4/2013 |
| WO | 2021165631 A1 | 8/2021 |

* cited by examiner

*Primary Examiner* — Dominick L Plakkoottam
(74) *Attorney, Agent, or Firm* — BelayIP

(57) ABSTRACT

A controller for an e-machine of a turbomachine includes a coolant core with a first seat and a second seat thereon. The controller includes a semiconductor circuit component that is seated on the first seat and that is thermally coupled to the coolant core to be cooled thereby. The controller also includes a bus bar that is seated on the second seat and that is thermally coupled to the coolant core to be cooled thereby. The bus bar is thermally coupled to the semiconductor circuit component to receive heat from the semiconductor circuit component and to define a thermal path from the semiconductor circuit component, through the bus bar, and to the coolant core.

18 Claims, 5 Drawing Sheets

INTEGRATED E-MACHINE CONTROLLER FOR TURBOMACHINE HAVING THERMAL PATH FOR COMPACTLY PACKAGED ELECTRONICS

TECHNICAL FIELD

The present disclosure generally relates to a controller, for example, of an e-machine of a turbomachine and, more particularly, relates to an integrated e-machine controller for a turbomachine having a thermal path for compactly packaged electronics thereof.

BACKGROUND

Some turbomachines include an e-machine, such as an electric motor or generator. More specifically, some turbochargers, superchargers, or other fluid compression devices can include an electric motor that is operably coupled to the same shaft that supports a compressor wheel, turbine wheel, etc. The electric motor may drivingly rotate the shaft, for example, to assist a turbine stage of the device. In some embodiments, the e-machine may be configured as an electric generator, which converts mechanical energy of the rotating shaft into electric energy.

These devices may also include a controller that, for example, controls operation of the e-machine. More specifically, the control system may control the torque, speed, or other operating parameters of the e-machine and, as such, control operating parameters of the rotating group of the turbomachine.

However, conventional controllers of such fluid compression devices suffer from various deficiencies. These controllers can be heavy and/or bulky. Furthermore, the electronics included in the controller may generate significant heat, which can negatively affect operations. Similarly, the operating environment of the device can subject the electronics to high temperatures, vibrational loads, or other conditions that negatively affect operations. In addition, manufacture and assembly of conventional control systems can be difficult, time consuming, or otherwise inefficient.

Thus, it is desirable to provide an e-machine controller for a fluid compression device that is retained in a robust manner. It is also desirable to provide a compact controller that operates at high efficiency. It is also desirable to provide a controller that provides a highly effective cooling effect. It is also desirable to provide improvements that increase manufacturing efficiency for such a controller. Other desirable features and characteristics of the present disclosure will become apparent from the subsequent detailed description and the appended claims, taken in conjunction with the accompanying drawings and this background discussion.

BRIEF SUMMARY

In one embodiment, a controller for an e-machine of a turbomachine is disclosed. The controller includes a coolant core with a first seat and a second seat thereon. The controller includes a semiconductor circuit component that is seated on the first seat and that is thermally coupled to the coolant core to be cooled thereby. The controller also includes a bus bar that is seated on the second seat and that is thermally coupled to the coolant core to be cooled thereby. The bus bar is thermally coupled to the semiconductor circuit component to receive heat from the semiconductor circuit component and to define a thermal path from the semiconductor circuit component, through the bus bar, and to the coolant core.

Additionally, a method of manufacturing a controller for an e-machine of a turbomachine is disclosed. The method includes providing a coolant core that has a first seat and a second seat thereon. The method also includes seating a semiconductor circuit component on the first seat including thermally coupling the semiconductor circuit component to the coolant core to be cooled thereby. Furthermore, the method includes seating a bus bar on the second seat including thermally coupling the bus bar to the coolant core to be cooled thereby. Additionally, the method includes thermally coupling the bus bar to the semiconductor circuit component to define a thermal path for heat transfer from the semiconductor circuit component, through the bus bar, and to the coolant core In another embodiment, a compressor device is disclosed according to example embodiments. The compressor device includes a compressor section and a motor configured to drive a compressor wheel of the compressor section in rotation about an axis. Furthermore, the compressor device includes an integrated controller for the motor that includes a coolant core that extends about the axis and that includes a first seat and a second seat. The first seat is included on an outer radial area of the coolant core facing outward radially from the axis. The second seat is included on an axial end of the coolant core. The coolant core includes an internal fluid passage configured to receive a flow of a coolant. Moreover, the controller includes a semiconductor circuit component that is seated on the first seat and that is thermally coupled to the coolant core to be cooled thereby. The controller also includes a bus bar that extends about the axis, that is seated on the second seat, and that is thermally coupled to the coolant core to be cooled thereby. The bus bar is thermally coupled to the semiconductor circuit component to receive heat from the semiconductor circuit component and to define a thermal path from the semiconductor circuit component, through the bus bar, and to the coolant core

BRIEF DESCRIPTION OF THE DRAWINGS

The present disclosure will hereinafter be described in conjunction with the following drawing figures, wherein like numerals denote like elements, and wherein.

DETAILED DESCRIPTION

Figure 1:
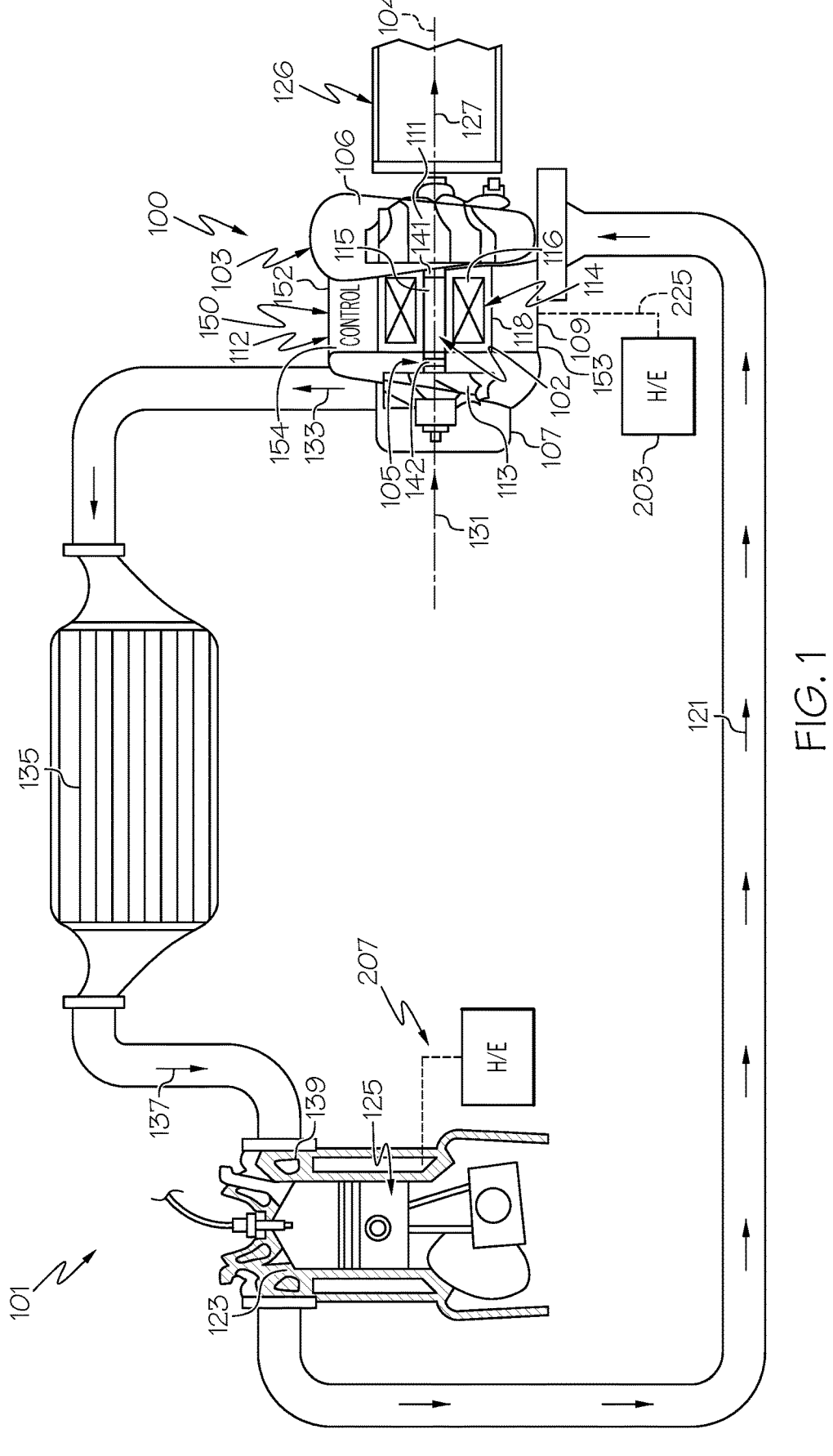
FIG. 1 is a schematic illustration of an engine system with a fluid compressor device that includes an integrated controller according to example embodiments of the present disclosure.

The following detailed description is merely exemplary in nature and is not intended to limit the present disclosure or the application and uses of the present disclosure. Furthermore, there is no intention to be bound by any theory presented in the preceding background or the following detailed description.

Broadly, example embodiments disclosed herein include an improved controller for a turbomachine. The controller may be integrated into, packaged among, and compactly arranged on the turbomachine for improved performance and for reducing the size and profile of the turbomachine. In some embodiments, the integrated controller may wrap, extend, span circumferentially, or otherwise be arranged about an axis of rotation defined by the rotating group of the turbomachine. The housing of the controller may be generally arcuate in some embodiments, and internal components (e.g., support structures, electronics components, and/or coolant system features) may be shaped, configured, assembled, and arranged about the axis to reduce the size of the turbomachine.

In addition, the turbomachine may be a compressor device, and the integrated controller may be arranged proximate the compressor section (e.g., proximate a compressor housing). Furthermore, the turbomachine may include a turbine section, and the compressor device may be disposed proximate thereto (e.g., proximate the turbine housing). The controller may, in some embodiments, be arranged compactly between a compressor section and a turbine section of the turbomachine. Furthermore, in some embodiments, the integrated controller may be wrapped or disposed about an e-machine (e.g., a motor) of the turbomachine. The controller may be configured for controlling the e-machine and their close proximity may increase operating efficiency. The controller may, thus, be closely integrated and packaged within the turbomachine. The components may be securely and robustly supported within the integrated controller.

The integrated controller may also include a number of electronics components for controlling operations of the e-machine. These electronics components may include one or more semiconductor circuit components, capacitors, inverters, bus bars, circuit boards, switch components, MOSFET transistors, etc.

The integrated controller may also include a number of features for cooling the electronics components of the integrated controller and/or for cooling surrounding components of the turbomachine. For example, the integrated controller may include a coolant core, which receives a flow of coolant for removing heat from the electronics components and/or other components. The coolant core may include one or more mounts, seats, attachment areas, etc. that may be used to support electronics components, and the resulting interface may increase the cooling effect. Thus, the electronics components may be tightly packed, and the turbomachine may operate at extreme conditions, yet the cooling features may maintain temperatures within an acceptable range.

Furthermore, components can be arranged compactly together within the integrated controller and, yet, may be packaged in a thermally efficient manner. For example, electronics components may be arranged in close proximity and/or may abut so as to be thermally coupled. Accordingly, a thermal path may be defined from one component and to the other. In some embodiments, one electronics component may be configured as a heat sink to another. Furthermore, in some embodiments, one electronics component may provide a thermal path from one electronics component to a coolant core of a fluid coolant system of the integrated controller.

In some embodiments, the integrated controller may include at least one semiconductor circuit components, such as a transistor module (e.g., MOSFET transistor). The semiconductor circuit component may include switches (switch elements) and leads/terminals, and the semiconductor circuit component may be supported on a fluid-cooled support structure (e.g., cold plate, coolant core, etc.) of the controller. Thus, the semiconductor circuit component may be partially cooled by the fluid-cooled support structure. Additional cooling of the semiconductor circuit component may be provided via a thermal path through another electrical component. For example, the integrated controller may include at least one bus bar that is supported on the fluid-cooled support structure, proximate the semiconductor circuit component. The bus bar may be electrically connected to the power leads/terminals of the semiconductor circuit component. This may also establish a thermal connection, wherein heat generated by the semiconductor circuit component may be transferred from the semiconductor circuit component to the bus bar, and the bus bar may, in-turn, be cooled by the fluid-cooled support structure. The bus bar may have a relatively large surface area contact with the coolant core, especially as compared with that of the semiconductor circuit component.

Accordingly, there may be high cooling effectiveness and increased operating efficiency of the controller overall. The integrated controller may operate efficiently and within acceptable operating temperatures across a wide range of operating conditions. The electronic components may be tightly packed and may operate within extreme conditions, yet the controller may maintain operations over a long operating lifetime. Additionally, features of the present disclosure may provide increases in manufacturing efficiency.

FIG. 1 is a schematic view of an example turbomachine, such as a turbocharger 100 that is incorporated within an engine system 101 and that includes one or more features of the present disclosure. It will be appreciated that the turbocharger 100 could be another turbomachine (e.g., a supercharger, a turbine-less compressor device, etc.) in additional embodiments of the present disclosure. Furthermore, the turbomachine of the present disclosure may be incorporated into a number of systems other than an engine system without departing from the scope of the present disclosure. For example, the turbomachine of the present disclosure may be incorporated within a fuel cell system for compressing air that is fed to a fuel cell stack, or the turbomachine may be incorporated within another system without departing from the scope of the present disclosure.

Generally, the turbocharger 100 may include a housing 103 and a rotating group 102, which is supported within the housing 103 for rotation about an axis 104 by a bearing system 105. The bearing system 105 may be of any suitable type, such as a roller-element bearing or an air bearing system.

As shown in the illustrated embodiment, the housing 103 may include a turbine housing 106, a compressor housing 107, and an intermediate housing 109. The intermediate housing 109 may be disposed axially between the turbine and compressor housings 106, 107.

Additionally, the rotating group 102 may include a turbine wheel 111, a compressor wheel 113, and a shaft 115. The turbine wheel 111 is located substantially within the turbine housing 106. The compressor wheel 113 is located substantially within the compressor housing 107. The shaft 115 extends along the axis of rotation 104, through the intermediate housing 109, to connect the turbine wheel 111 to the compressor wheel 113. Accordingly, the turbine wheel 111 and the compressor wheel 113 may rotate together as a unit about the axis 104.

The turbine housing 106 and the turbine wheel 111 cooperate to form a turbine stage (i.e., turbine section) configured to circumferentially receive a high-pressure and high-temperature exhaust gas stream 121 from an engine, specifically, from an exhaust manifold 123 of an internal combustion engine 125. The turbine wheel 111 and, thus, the other components of the rotating group 102 are driven in rotation around the axis 104 by the high-pressure and high-temperature exhaust gas stream 121, which becomes a lower-pressure and lower-temperature exhaust gas stream 127 that is released into a downstream exhaust pipe 126.

The compressor housing 107 and compressor wheel 113 cooperate to form a compressor stage (i.e., compressor section). The compressor wheel 113, being driven in rotation by the exhaust-gas driven turbine wheel 111, is configured to compress received input air 131 (e.g., ambient air, or already-pressurized air from a previous-stage in a multi-stage compressor) into a pressurized airstream 133 that is ejected circumferentially from the compressor housing 107. The compressor housing 107 may have a shape (e.g., a volute shape or otherwise) configured to direct and pressurize the air blown from the compressor wheel 113. Due to the compression process, the pressurized air stream is characterized by an increased temperature, over that of the input air 131.

The pressurized airstream 133 may be channeled through an air cooler 135 (i.e., intercooler), such as a convectively cooled charge air cooler. The air cooler 135 may be configured to dissipate heat from the pressurized airstream 133, increasing its density. The resulting cooled and pressurized output air stream 137 is channeled into an intake manifold 139 of the internal combustion engine 125, or alternatively, into a subsequent-stage, in-series compressor.

Furthermore, the turbocharger 100 may include an e-machine stage 112. The e-machine stage 112 may be cooperatively defined by the intermediate housing 109 and by an e-machine 114 housed therein. The shaft 115 may extend through the e-machine stage 112, and the e-machine 114 may be operably coupled thereto. The e-machine 114 may be an electric motor, an electric generator, or a combination of both. Thus, the e-machine 114 may be configured as a motor to convert electrical energy to mechanical (rotational) energy of the shaft 115 for driving the rotating group 102. Furthermore, the e-machine 114 may be configured as a generator to convert mechanical energy of the shaft 115 to electrical energy that is stored in a battery, etc. As stated, the e-machine 114 may be configured as a combination motor/generator, and the e-machine 114 may be configured to switch functionality between motor and generator modes in some embodiments as well.

For purposes of discussion, the e-machine 114 will be referred to as a motor 116. The motor 116 may include a rotor member (e.g., a plurality of permanent magnets) that are supported on the shaft 115 so as to rotate with the rotating group 102. The motor 116 may also include a stator member (e.g., a plurality of windings, etc.) that is housed and supported within the intermediate housing 109. In some embodiments, the motor 116 may be disposed axially between a first bearing 141 and a second bearing 142 of the bearing system 105. Also, the motor 116 may be housed by a motor housing 118 of the intermediate housing 109. The motor housing 118 may be a thin-walled or shell-like housing that encases the stator member of the motor 116. The motor housing 118 may also encircle the axis 104, and the shaft 115 may extend therethrough.

Furthermore, the turbocharger 100 may include an integrated controller 150. The integrated controller 150 may generally include a controller housing 152 and a number of internal components 154 (e.g., circuitry, electronic components, cooling components, support structures, etc.) housed within the controller housing 152. The integrated controller 150 may control various functions. For example, the integrated controller 150 may control the motor 116 to thereby control certain parameters (torque, angular speed, START/STOP, acceleration, etc.) of the rotating group 102. The integrated controller 150 may also be in communication with a battery, an electrical control unit (ECU), or other components of the respective vehicle in some embodiments. More specifically, the integrated controller 150 may receive DC power from a vehicle battery, and the integrated controller 150 may convert the power to AC power for controlling the motor 116. In additional embodiments wherein the e-machine 114 is a combination motor/generator, the integrated controller 150 may operate to switch the e-machine 114 between its motor and generator functionality.

Figure 3:
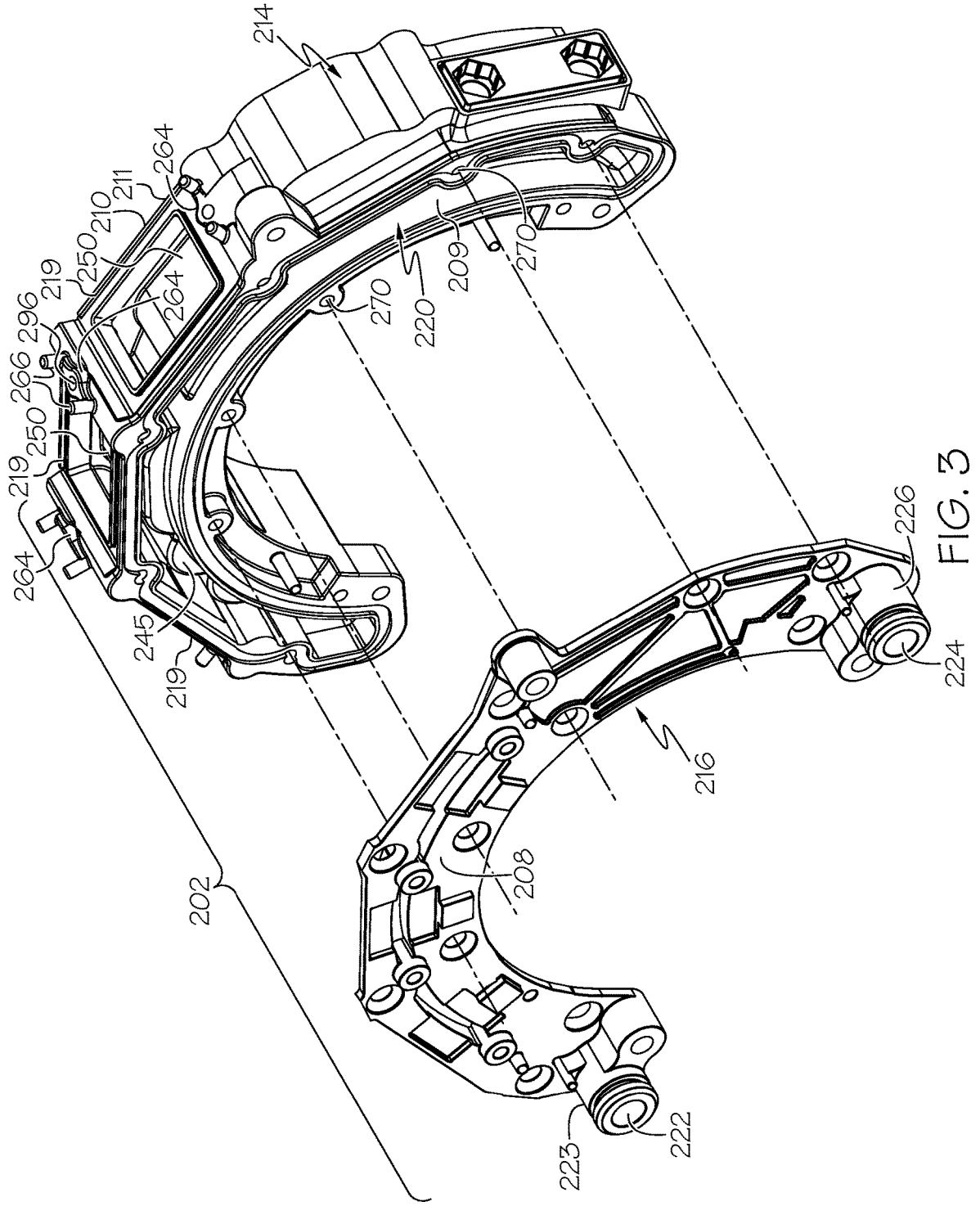
FIG. 3 is an exploded isometric view of a coolant core of the integrated controller of FIG. 2 from a first perspective.
Figure 4:
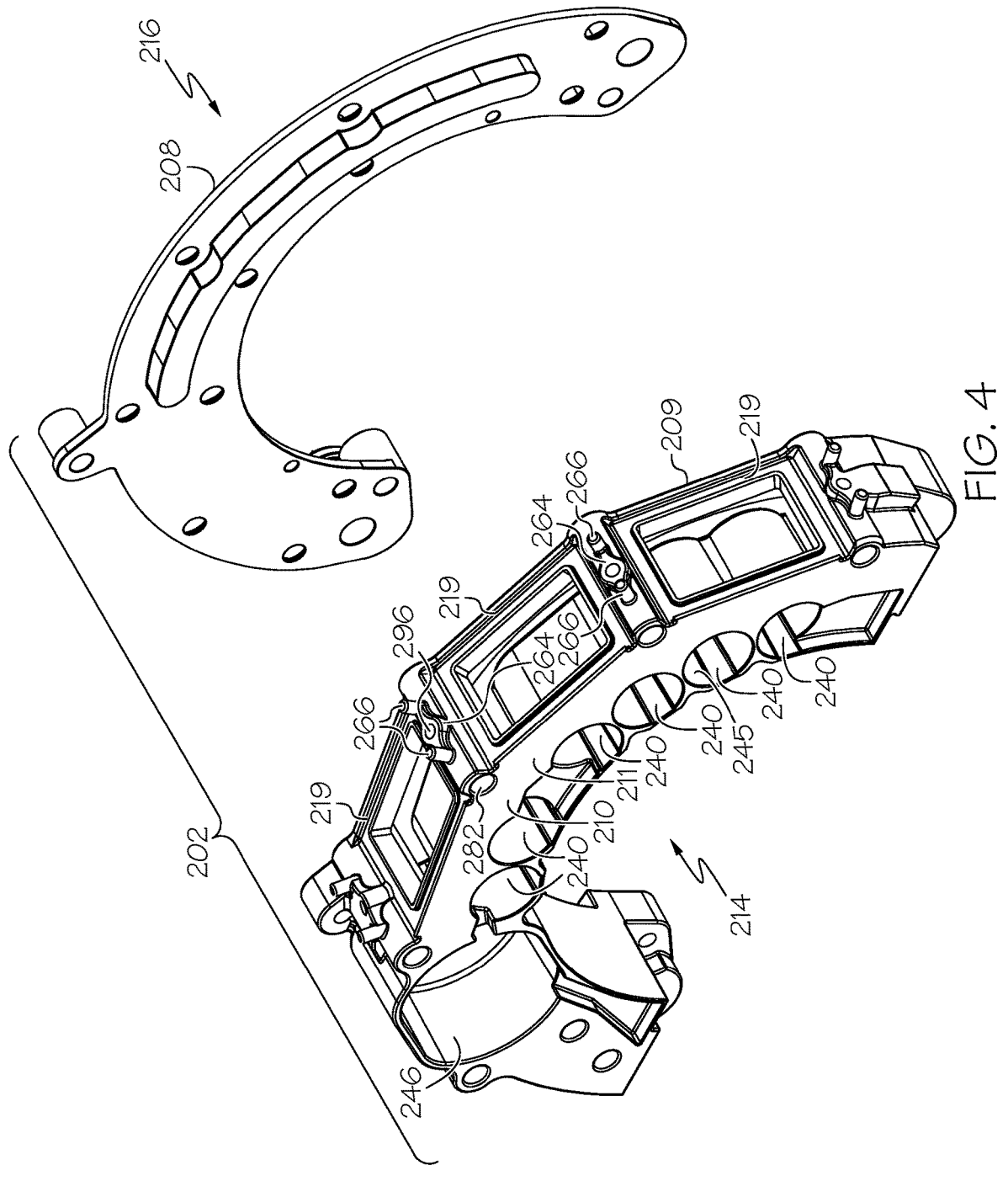
FIG. 4 is an exploded isometric view of a coolant core of the integrated controller of FIG. 2 from a second perspective.

In some embodiments, the integrated controller 150 may be disposed axially between the compressor stage and the turbine stage of the turbocharger 100 with respect to the axis 104. The controller 150 may also be disposed axially between the first and second bearings 141, 142. Thus, as illustrated, the integrated controller 150 may be disposed and may be integrated proximate the motor 116. For example, as shown in the illustrated embodiment, the integrated controller 150 may be disposed on and may be arranged radially over the motor housing 118. More specifically, the integrated controller 150 may extend and wrap about the axis 104 to cover over the motor 116 such that the motor 116 is disposed radially between the shaft 115 and the integrated controller 150. The integrated controller 150 may also extend about the axis 104 in the circumferential direction and may cover over, overlap, and wrap over at least part of the motor housing 118. In some embodiments, the integrated controller 150 may wrap between approximately forty-five degrees (45°) and three-hundred-sixty-five degrees (365°) about the axis 104. For example, as shown in FIGS. 2-4, the controller 150 may wrap approximately one-hundred-eighty degrees (180°) about the axis 104.

Figure 2:
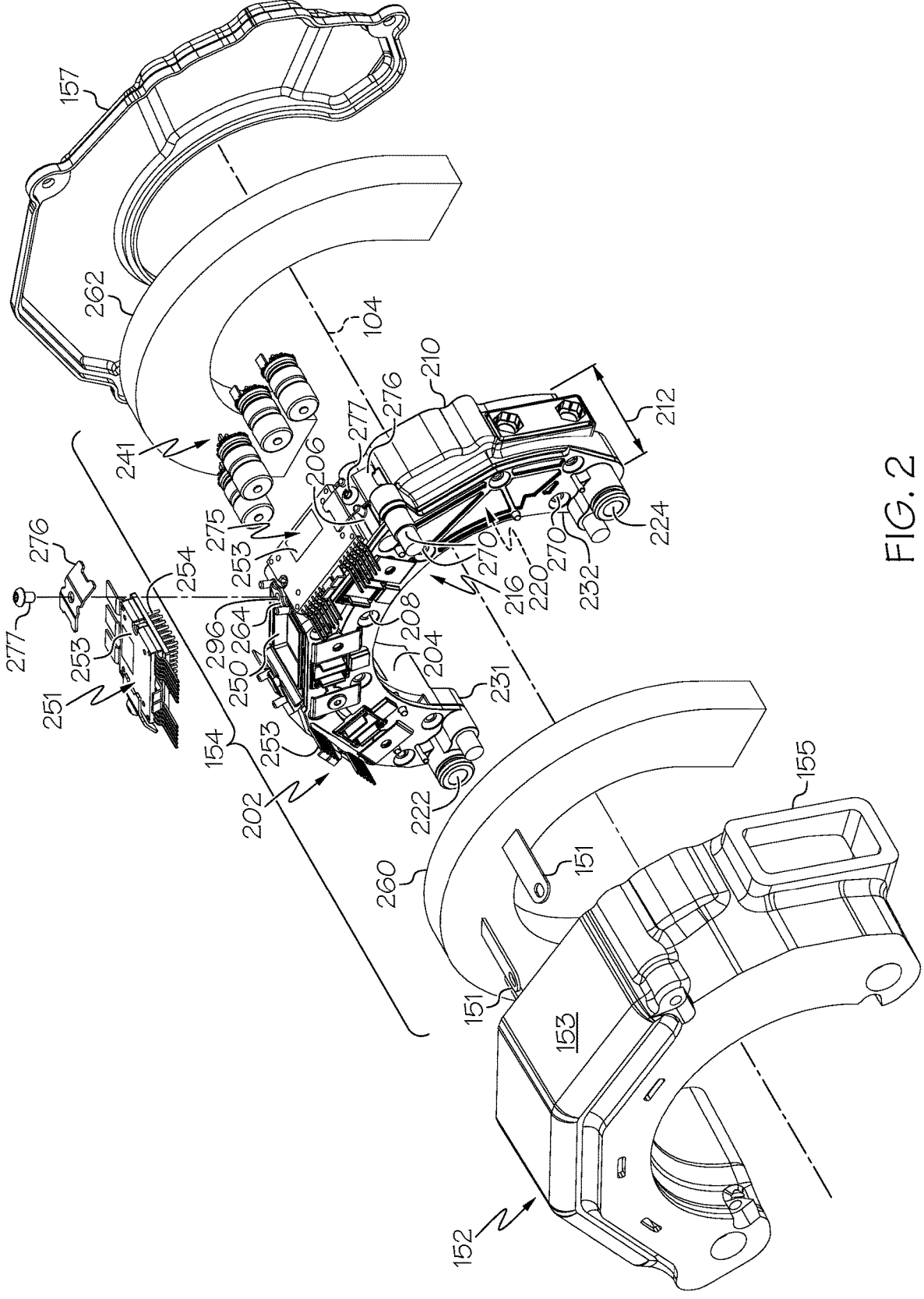
FIG. 2 is an exploded isometric and partly schematic view of the integrated controller according to example embodiments of the present disclosure.

FIG. 2 shows the controller housing 152 according to various example embodiments of the present disclosure. As illustrated, the housing 152 may generally be arcuate (e.g., crescent-shaped) so as to extend about the axis 104 and to conform generally to the rounded profile of the turbocharger 100. The housing 152 may also be an outer shell-like member that is hollow and that encapsulates the internal components 154. In some embodiments, the housing 152 may be cooperatively defined by an outer housing body 155 and a cover 157 that covers over an open end of the outer housing body 155. The housing 152 may attach to the motor housing 118, for example on an inner radial area and/or on an axial face thereof. Electrical connectors 151 may extend through the housing 152 for electrically connecting the internal components 154 to external systems. Furthermore, there may be openings for fluid couplings (e.g., couplings for fluid coolant). In some embodiments, there may be electrical connectors and fluid couplings that extend along a common direction (e.g., a single direction along the axis 104) to facilitate assembly of the turbocharger 100. Additionally, the controller housing 152 may define part of the exterior of the turbocharger 100. An outer surface 153 of the controller housing 152 may extend about the axis 104 and may face radially away from the axis 104. At least part of the outer surface 153 may be smoothly contoured about the axis 102, and at least part of the outer surface 153 may include one or more flat panels that are disposed tangentially with respect to the axis 104 at different angular positions. The outer surface 153 may be disposed generally at the same radius as the neighboring compressor housing 107 and/or turbine housing 106 as shown in FIG. 1. Accordingly, the overall size and profile of the turbocharger 100, including the controller 150, may be very compact.

The internal components 154 of the controller 150 may be housed within the controller housing 152. Also, at least some of the internal components 154 may extend arcuately, wrap about, and/or may be arranged about the axis 104 as will be discussed. Furthermore, as will be discussed, the internal components 154 may be stacked axially along the axis 104 in close proximity such that the controller 150 is very compact. As such, the integrated controller 150 may be compactly arranged and integrated with the turbine stage, the compressor stage, and/or other components of the turbocharger 100. Also, internal components 154 of the controller 150 may be in close proximity to the motor 116 to provide certain advantages. For example, because of this close proximity, there may be reduced noise, less inductance, etc. for more efficient control of the motor 116.

In addition to electronics components for electronic control of the motor 116, the controller 150 may include a number of components 154 that provide robust support. The controller 150 may also include components that provide efficient cooling. Thus, the turbocharger 100 may operate at extreme conditions due to elevated temperatures, mechanical loads, electrical loads, etc. Regardless, the controller 150 may be tightly integrated into the turbocharger 100 without compromising performance.

As shown in FIG. 2, the internal components 154 of the integrated controller 150 may include a coolant core 202. The coolant core 202 is shown in isolation in FIGS. 3 and 4 for clarity. As will be discussed, the coolant core 202 may be configured for supporting a number of electronics components, fastening structures, and other parts of the integrated controller 150. As such, the coolant core 202 may be referred to as a "support structure." The coolant core 202 may be fluidly-cooled, and as such, the coolant core 202 may be referred to as a "cooling plate, etc." The coolant core 202 may define one or more coolant passages through which a fluid coolant flows. As such, the coolant core 202 may receive a flow of a coolant therethrough for cooling the integrated controller 150.

The coolant core 202 may be elongate but curved and arcuate in shape and may extend in a tangential and/or circumferential direction about the axis 104. In other words, the coolant core 202 may wrap at least partially about the axis 104 to fit about the motor 116 of the turbocharger 100. Accordingly, the coolant core 202 may define an inner radial area 204 that faces the axis 104 and an outer radial area 206 that faces away from the axis 104. Moreover, the coolant core 202 may include a first axial end 208 and a second axial end 210, which face away in opposite axial directions. The first axial end 208 may face the compressor section of the turbocharger 100 in some embodiments and the second axial end 210 may face the turbine section in some embodiments. The coolant core 202 may also define an axial width 212, which may be defined parallel to the axis 104 between the first and second axial ends 208, 210. Additionally, the coolant core 202 may be semi-circular and elongate so as to extend circumferentially between a first angular end 231 and a second angular end 232, which are spaced apart angularly about the axis 104 (e.g., approximately one-hundred-eighty degrees (180°) apart).

As shown in FIGS. 3 and 4, the coolant core 202 may be cooperatively defined by a plurality of parts, such as a reservoir body 214 and a cover plate 216. Both the reservoir body 214 and the cover plate 216 may be made from strong and lightweight material with relatively high thermal conductivity characteristics (e.g., a metal, such as aluminum). In some embodiments, the reservoir body 214 and/or the cover plate 216 may be formed via a casting process (e.g., high pressure die casting).

The cover plate 216 may be relatively flat, may be arcuate (e.g., semi-circular), and may lie substantially normal to the axis 104. Also, the cover plate 216 may define the first axial end 208 of the coolant core 202. The reservoir body 214 may be a generally thin-walled and hollow body with an open side 209 that is covered over by the cover plate 216 and a second side 211 that defines the second axial end 210 of the coolant core 202. The cover plate 216 may be fixed to the reservoir body 214 and sealed thereto with a gasket, seal, etc. One or more fasteners (e.g., bolts or other fasteners may extend axially through the cover plate 216 and the reservoir body 214 for attaching the same. The cover plate 216 and the reservoir body 214 may include one or more fastener holes 270 that receive a bolt or other fastener for attaching the first side electronics to the coolant core 202. Accordingly, the cover plate 216 and the reservoir body 214 may cooperate to define a fluid passage 220 that extends through the coolant core 202. In some embodiments, the fluid passage 220 may be elongate and may extend generally about the axis 104 from the first angular end 231 to the second angular end 232.

The coolant core 202 may also include at least one fluid inlet 222 to the fluid passage 220 and at least one fluid outlet 224 from the fluid passage 220. In some embodiments, for example, there may be a single, solitary inlet 222. The inlet 222 may be disposed proximate the first angular end 231 and may include a round, cylindrical, and hollow connector 223 that projects along the axis 104 from the cover plate 216 away from the first axial end 208. Also, in some embodiments, there may be a single, solitary outlet 224. The outlet 224 may be disposed proximate the second angular end 232 and may include a round, cylindrical, and hollow connector 226 that projects along the axis 104 from the cover plate 216 away from the first axial end 208.

The coolant core 202 may be fluidly connected to a coolant circuit 225, which is illustrated schematically in FIG. 1. The coolant circuit 225 may circulate any suitable fluid, such as a liquid coolant, between the fluid passage 220 and a heat exchanger 203 (FIG. 1). More specifically, coolant may flow from the inlet 222, through the fluid passage 220, to the outlet 224, thereby removing heat from the integrated controller 150, and may continue to flow through the heat exchanger 203 to be cooled before flowing back to the inlet 222 of the coolant core 202, and so on. Furthermore, as shown in FIG. 1, the heat exchanger 203 may, in some embodiments, be separate and fluidly independent of an engine coolant system 207 that cools the engine 125.

As shown in FIG. 4, the second axial end 210 of the coolant core 202 may include one or more inner apertures 240. The inner apertures 240 may include a plurality of pockets, recesses, receptacles, etc. that are open at the second side 211 of the reservoir body 214 and that are disposed proximate the inner radial area 204 of the core 202 in the radial direction. As shown, the inner apertures 240 may be generally cylindrical in some embodiments with circular profiles and with the longitudinal axis thereof arranged parallel to the axis 104. There may be a plurality of inner apertures 240 arranged at different angular positions with respect to the axis 104 along the inner radial area 204 of the core 202. The size and shape of the inner apertures 240 may correspond to certain ones of the internal components 154 of the integrated controller 150. For example, the inner apertures 240 may be cylindrical, as shown, to receive and support inner electronics components, such as a series of capacitors 241 (FIG. 2) of the controller 150. Furthermore, as shown in FIGS. 3 and 4, the reservoir body 214 may define the apertures 240 with relatively thin walls 245 or other structures that separate the capacitors 241 within the apertures 240 from the coolant within the fluid passage 220. Accordingly, the capacitors 241 may be effectively cooled by the coolant circuit 225.

Likewise, as shown in FIG. 4, the second side 211 of the reservoir body 214 may include a second side aperture 246 that has an ovate profile and that is recessed in the axial direction into the reservoir body 214. The second side aperture 246 may be arranged with the major axis of its ovate shape extending tangentially with respect to the axis 104. Also, the minor axis may extend radially and may be large enough to extend over both the inner radial area 204 and the outer radial area 206 of the coolant core 202. Furthermore, the second side aperture 246 may be shaped correspondingly to another electronics component, such as an inverter, capacitor, a battery, or another piece of control equipment.

Additionally, the outer radial area 206 of the coolant core 202 may extend about the axis 104 and may include one or more outer seats 219. The seats 219 may be rectangular and may lie in a respective tangential plane with respect to the axis 104. The seats 219 may be disposed and spaced apart circumferentially at different angular positions with respect to the axis 104. Furthermore, seats 219 may include a respective outer aperture 250 extending radially through to the interior of the core 202. In some embodiments, at least one outer aperture 250 may be a rectangular hole that is centered within the respective seat 219 and that passes through the reservoir body 214 to the fluid passage 220 therein. The seat 219 may include the rectangular rim of the respective aperture 250.

Figure 5:
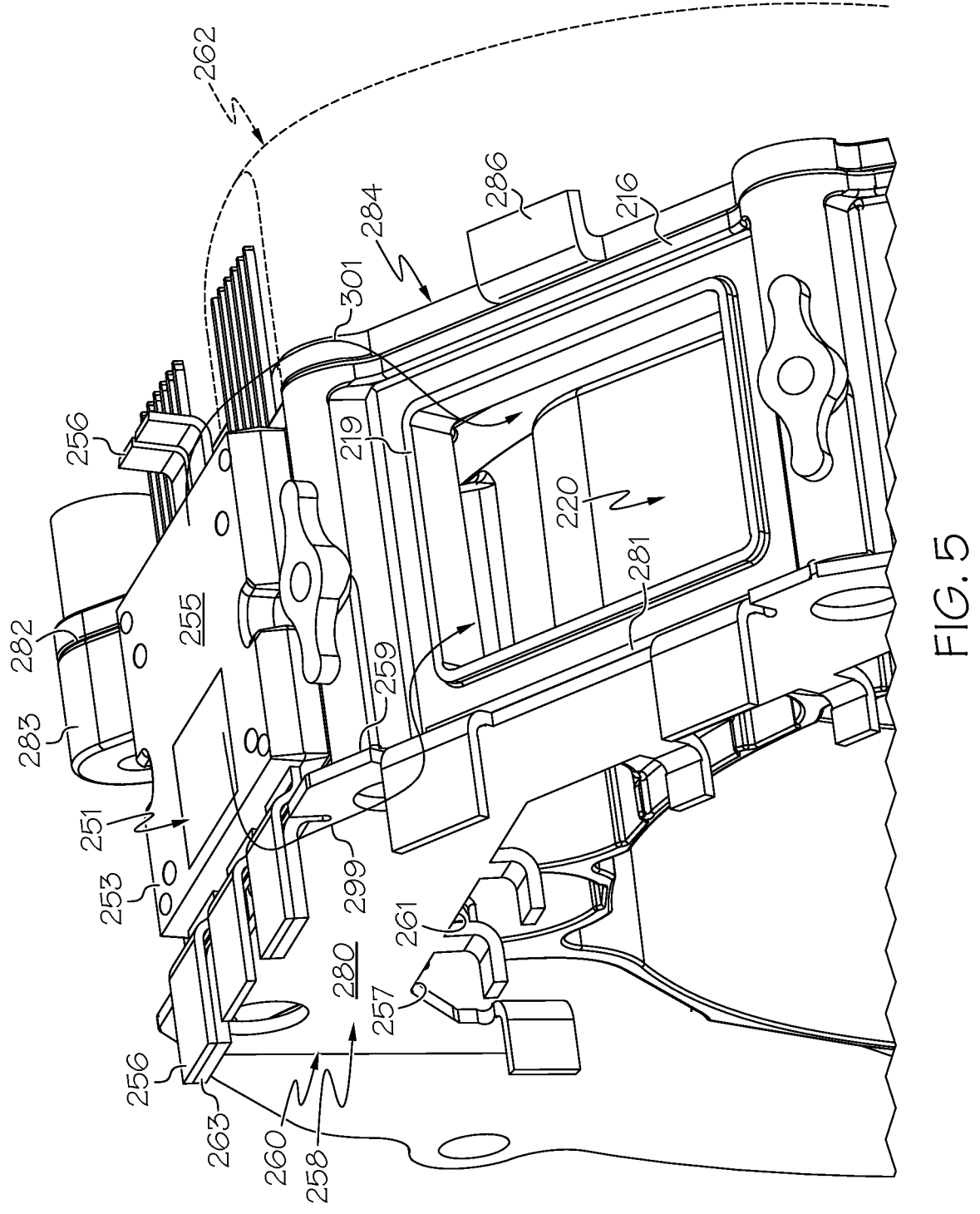
FIG. 5 is an isometric view of the coolant core and parts of an electronics package of the integrated controller of FIG. 2 according to example embodiments of the present disclosure.

These outer apertures 250 may be sized and configured to receive an outer electronics component 251 (FIGS. 2 and 5). This component 251 may be and/or may include a semiconductor circuit component, such as a substantially-flat and rectangular transistor 253. The transistor 253 may be a circuit component, switch component, MOSFET transistor, or another type. As shown in FIG. 5, the transistor 253 may include a central portion 255, which may include a plurality of embedded switches and/or other electrical elements. The transistor 253 may also include a plurality of leads 256. The leads 256 may be flat, thin, and rectangular, and the leads 256 may each project from a respective side of the central portion 255. In some embodiments, the leads 256 may extend and project in an axial direction along the axis 104 (e.g., substantially within a plane common with the central portion 255).

The transistor 253 may be seated on a respective one of the seats 219. The transistor 253 may be partially received in one of the apertures 250 and may be supported and mounted on a respective seat 219 so as to cover over the respective outer aperture 250. There may be a gasket or other sealing member that seals the transistor 253 to the seat 219. Also, the transistor 253 may include one or more thermally-conductive projections 254 (FIG. 2), such as an array of fins, rails, posts, pins, etc.) that project from an underside thereof to extend into the fluid passage 220. Accordingly, coolant within the coolant circuit 225 may flow across the projections 254 to provide highly effective cooling to the transistor 253.

As shown in FIG. 2, the integrated controller 150 may include a fastener arrangement 275 used for attaching at least one of the transistors 253 to the coolant core 202. The fastener arrangement 275 may include at least one resilient clip 276. The fastener arrangement 275 may also include fasteners 277 used to attach respective clips 276 to the coolant core 202. Also, in some embodiments, the fastener arrangement 275 may include a plurality of clips 276 and fasteners 277 for retaining a plurality of the transistors 253 on the core 202 (e.g., on the outer radial area 206 of the core 202).

The coolant core 202 may include features of the fastener arrangement 275 as well. As shown in FIGS. 3 and 4, the coolant core 202 may include mounts 264 for the retainer clips 276. The mounts 264 may be flat areas on the outer radial area 206 that project outward radially. The mounts 264 may include a clip mounting hole 296 that may be threaded. Also, the mounts 264 may include one or more (e.g., a pair) of posts 266 or other small radial projections. The posts 266 may be disposed on opposite axial sides of the respective hole 296.

The fastener arrangement 275 may further include the plurality of fasteners 277. The fasteners 277 may include threaded bolts in some embodiments, which are configured to be received within respective ones of the holes 296 to conveniently and efficiently install the transistors 253 to the coolant core 202.

The first axial end 208 of the core 202 (defined substantially by the cover plate 216) may provide a seat 257 (i.e., a second seat) for mounting and supporting a first side electronics package 260 of the controller 150. The seat 257 may include one or more axially-facing surfaces of the first axial end 208. The seat 257 may be planar and/or may include a plurality of co-planar surfaces that are spaced apart across the first axial end 208. The seat 257 may include one or more surfaces on the end 208 that are arranged and/or that extend about the axis 104.

The first side electronics package 260 is represented schematically in FIG. 2 as a semi-circular body that corresponds generally to the shape of the coolant core 202. One or more parts of the first side electronics package 260 may be arcuate, may be elongate but extend about the axis 104, or may otherwise extend about the axis 104. It will be appreciated that the first side electronics package 260 may comprise a plurality of electronics components, such as one or more conductive bus bars, circuit board assemblies, etc.

FIG. 5 shows a portion of the first side electronics package 260 according to some embodiments. As shown, the first side electronics package 260 may include at least one bus bar 258. The bus bar 258 may be elongate and may extend about the axis 104. The bus bar 258 may include a first side 280, a second side 281, an inner radial edge 261, and an outer radial edge 259. The inner and outer radial edges 261, 259 may have a number of straight segments that are joined end-to-end so as to extend about the axis 104.

The bus bar 258 of the first side electronics package 260 may be layered on the seat 257 of the first axial end 208 of the coolant core 202. In some embodiments, there may be at least one additional bus bar that is layered atop the first side 280 of the bus bar 258 and stacked in the axial direction. The first side electronics package 260 may also include an arcuate circuit board assembly, an arcuate stiffening plate, fasteners, and/or other components arranged about the axis 104, and at least some of these components may be similarly stacked atop the first side 280 of the bus bar 258. The bus bar 258 and/or other components of the first side electronics package 260 may be attached to the first axial end 208 of the core 202 in any suitable fashion, such as fasteners. Accordingly, the first side electronics package 260 may be in close proximity with the coolant core 202 such that the coolant core 202 may absorb heat therefrom with high efficiency and effectiveness. In particular, a relatively large surface area of the second side 281 of the bus bar 258 may be layered upon and may abut against the seat 257 of the coolant core 202 for highly effective cooling.

Also, the bus bar 258 may include a plurality of projecting electrical terminals 263. At least one of the terminals 263 may be flat, thin, and rectangular. There may be a plurality of terminals 263, which may be bent rectangular projections that extend and project axially, away from the first side 280. The terminals 263 may be positioned to connect electrically and/or thermally with the leads 256 of the transistor 253. For example, the leads 256 may overlay and abut respective ones of the terminals 263. There may be at least one power connection established, and as will be discussed, this may also provide a thermal path for heat to transfer from the transistor 253, to the bus bar 258, and then to the coolant core 202.

As represented in FIG. 2, the second axial end 210 of the coolant core 202 may provide a seat 282 (i.e., a third seat) for mounting and supporting a second side electronics package 262 of the integrated controller 150. The seat 282 may face axially, in an opposite axial direction from the seat 257. The seat 282 may include one or more surfaces on the end 210 (on the cover plate 216) that are arranged and/or that extend about the axis 104. As shown in FIG. 5, the seat 282 may include radially-projected fastener holes 283 for attaching to the package 262.

Like the first side electronics package 260, the second side electronics package 262 is represented schematically in FIG. 2. However, FIG. 5 shows a portion of the second side electronics package 262 according to some embodiments. As shown, the second side electronics package 262 may include at least one bus bar 284. The bus bar 284 may be elongate and may extend about the axis 104, for example, as discussed above in relation to the bus bar 258. The bus bar 284 may also include terminals 286, which may be similar to the terminals 263 of the bus bar 258. The terminals 286 may be electrically and/or thermally connected to the leads 256 of the transistor 253.

The bus bar 284 may be configured for either alternating current (AC) or direct current (DC), and the bus bar 258 may be configured for the other. The bus bars 258, 284 may be operably and electrically attached via the transistors 253. Thus, DC power may be provided to the controller 150, for example, from a DC battery of a vehicle, and the motor 116 may be an AC motor that is controlled by the controller 150.

The bus bar 284 of the second side electronics package 262 may be layered and supported upon the seat 282. In some embodiments, there may be at least one additional bus bar that is layered atop the bus bar 284 and stacked in the axial direction. The second side electronics package 262 may also include an arcuate circuit board assembly, an arcuate stiffening plate, fasteners, and/or other components arranged about the axis 104, and at least some of these components may be similarly stacked atop the bus bar 284. The bus bar 284 and/or other components of the second side electronics package 262 may be attached to the second axial end 210 of the core 202 in any suitable fashion, such as fasteners. Accordingly, the second side electronics package 262 may be in close proximity with the coolant core 202 such that the coolant core 202 may absorb heat therefrom with high efficiency and effectiveness. In particular, a relatively large surface area of the bus bar 284 may be layered upon and may abut against the seat 282 of the coolant core 202 for highly effective cooling.

The fluid passage 220 for the coolant within the coolant core 202 may be defined between the inner surfaces of the reservoir body 214, the inner face of the cover plate 216, and the inner faces of the transistors 253. The fluid passage 220 may also extend arcuately about the axis 104, from the inlet 222 to the outlet 224. Coolant may enter via the inlet 222, flow generally from the first angular end 231 to the second angular end 232 and exit via the outlet 224. Accordingly, the coolant may flow in close proximity and across the core-facing surfaces of the transistors 253, the capacitors 241, the first side electronics package 260, and the second side electronics package 262.

During operations, the transistors 253 may produce a significant amount of heat and may be generally hotter than the bus bar 258 and/or the bus bar 284. As mentioned above, the attachment between the leads 256 and the terminals 263 may establish a first thermal path 299 such that heat of the transistor 253 may transfer to the bus bar 258, which may be cooled by the coolant core 202. In addition or in the alternative, the attachment between the leads 256 and the terminals 286 of the bus bar 284 may establish a second thermal path 301 such that heat of the transistor 253 may transfer to the bus bar 284, which may be cooled by the coolant core 202.

Thus, in some embodiments, the transistor 253 may be partially cooled by the fluid-cooled coolant core 202. Additional cooling of the transistor may be provided via the first and/or the second thermal path 299, 301. The bus bars 258, 284 may have a relatively large surface area contact with the coolant core 202, which increases the cooling effect.

Accordingly, the controller 150 may be integrated and packaged among the turbine section, the motor 116, and/or the compressor section of the turbocharger 100. The coolant core 202 and the coolant circuit 225 may provide effective cooling despite compact packaging of these components. The thermal connections between the transistors 253 and the electronics packages 260, 262 serve to increase cooling efficiency and cooling effectiveness.

Moreover, the controller 150 may be robustly supported. Also, the part count may be relatively low and the controller 150 may be manufactured and assembled in an efficient manner.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the present disclosure in any way. Rather, the foregoing detailed description will provide those skilled in the art with a convenient road map for implementing an exemplary embodiment of the present disclosure. It is understood that various changes may be made in the function and arrangement of elements described in an exemplary embodiment without departing from the scope of the present disclosure as set forth in the appended claims.

What is claimed is:

1. A controller for an e-machine of a turbomachine having a rotating group that is supported for rotation about a rotation axis comprising:

a fluid-cooled coolant core that extends about the rotation axis and that includes a first seat and a second seat thereon, the first seat included on an outer radial area of the coolant core, the outer radial area facing outward radially from the rotation axis, the second seat included on an axial end of the coolant core and facing axially away from the rotating group;

a semiconductor circuit component that is seated on the first seat and that is thermally coupled to the coolant core to be cooled thereby;

a bus bar that is elongated to extend circumferentially along a curvilinear path about the rotation axis along the axial end of the coolant core and is seated on the second seat and that is thermally coupled to the coolant core to be cooled thereby; and the bus bar being thermally coupled to the semiconductor circuit component by a direct conductive interface therebetween to receive heat from the semiconductor circuit component, through the direct conductive interface and the bus bar, and to direct heat to the coolant core.

2. The controller of claim 1, wherein the coolant core includes an internal liquid fluid passage configured to receive a flow of a liquid coolant for cooling the semiconductor circuit component and the bus bar.

3. The controller of claim 2, wherein the first seat is proximate an aperture into the internal liquid fluid passage, wherein the semiconductor circuit component is seated on the first seat to be partly received in the aperture.

4. The controller of claim 1, wherein the bus bar includes a projecting electrical terminal and the semiconductor circuit component includes a lead that overlaps the projecting electrical terminal for electrical and thermal connection therebetween.

5. The controller of claim 4, wherein the projecting electrical terminal and the lead project in an axial direction along the rotation axis.

6. The controller of claim 5, wherein the projecting electrical terminal is disposed radially between the lead and the rotation axis.

7. The controller of claim 4, wherein the projecting electrical terminal and the lead are substantially flat.

8. A method of manufacturing a controller for an e-machine of a turbomachine having a rotating group that is supported for rotation about a rotation axis comprising:

providing a fluid-cooled coolant core that extends about the rotation axis and that has a first seat and a second seat thereon, the first seat included on an outer radial area of the coolant core, the outer radial area facing outward radially from the rotation axis, the second seat included on an axial end of the coolant core and facing away from the rotating group;

seating a semiconductor circuit component on the first seat including thermally coupling the semiconductor circuit component to the coolant core via the first seat to be cooled thereby;

providing a bus bar that is elongated to extend along a curvilinear path;

seating the bus bar on the second seat including extending the bus bar axis along the curvilinear path circumferentially about the rotation axis along the axial end of the coolant core and thermally coupling the bus bar to the coolant core via the second seat to be cooled thereby; and thermally coupling the bus bar to the semiconductor circuit component by a direct conductive interface therebetween to define a thermal path for heat transfer from the semiconductor circuit component, through the direct conductive interface and the bus bar, and to the coolant core.

9. The method of claim 8, further comprising providing a flow of a liquid coolant through an internal fluid passage of the coolant core.

10. The method of claim 9, wherein the first seat is proximate an aperture into the internal fluid passage, and wherein seating the semiconductor circuit component includes partly receiving the semiconductor circuit component in the aperture.

11. The method of claim 8, wherein the bus bar includes a projecting electrical terminal and the semiconductor circuit component includes a lead; and further comprising overlapping the projecting electrical terminal and the lead for electrical and thermal connection therebetween.

12. The method of claim 11, wherein the projecting electrical terminal and the lead project in an axial direction along the rotation axis.

13. The method of claim 12, wherein the projecting electrical terminal is disposed radially between the lead and the rotation axis.

14. The method of claim 12, wherein the projecting electrical terminal and the lead are substantially flat.

15. A compressor device comprising:

a compressor section;

a motor configured to drive a compressor wheel of the compressor section in rotation about a rotation axis; and an integrated controller for the motor that includes:

a fluid-cooled coolant core that extends about the rotation axis and that includes a first seat and a second seat, the first seat included on an outer radial area of the coolant core facing outward radially from the rotation axis, the second seat included on an axial end of the coolant core and facing axially away from the motor, the coolant core including an internal liquid fluid passage configured to receive a flow of a liquid coolant;

a semiconductor circuit component that is seated on the first seat and that is thermally coupled to the coolant core via the first seat to be cooled thereby;

a bus bar that is elongated to extend along a curvilinear path that extends circumferentially about the rotation axis along the axial end of the coolant core, that is seated on the second seat, and that is thermally coupled to the coolant core via the second seat to be cooled thereby; and the bus bar being thermally coupled to the semiconductor circuit component by a direct conductive interface therebetween to receive heat from the semiconductor circuit component and to define a thermal path from the semiconductor circuit component, through the direct conductive interface and the bus bar, and to the coolant core.

16. The compressor device of claim 15, wherein the first seat is proximate an aperture into the internal fluid passage, wherein the semiconductor circuit component is seated on the first seat to be partly received in the aperture.

17. The compressor device of claim 15, wherein the bus bar includes a projecting electrical terminal and the semiconductor circuit component includes a lead that overlaps the projecting electrical terminal for electrical and thermal connection therebetween.

18. The compressor device of claim 17, wherein the projecting electrical terminal and the lead project along the rotation axis.

\* \* \* \* \*